(12) United States Patent
Tanzawa

(10) Patent No.: US 11,258,008 B2
(45) Date of Patent: Feb. 22, 2022

(54) SEMICONDUCTOR DEVICE AND MANUFACTURING METHOD FOR SAME

(71) Applicant: NATIONAL UNIVERSITY CORPORATION SHIZUOKA UNIVERSITY, Shizuoka (JP)

(72) Inventor: Toru Tanzawa, Hamamatsu (JP)

(73) Assignee: National University Corporation Shizuoka University

(*) Notice: Subject to any disclaimer, the term of this patent is extended or adjusted under 35 U.S.C. 154(b) by 161 days.

(21) Appl. No.: 16/642,526

(22) PCT Filed: Aug. 24, 2018

(86) PCT No.: PCT/JP2018/031369
§ 371 (c)(1),
(2) Date: Feb. 27, 2020

(87) PCT Pub. No.: WO2019/044705
PCT Pub. Date: Mar. 7, 2019

(65) Prior Publication Data
US 2020/0259080 A1 Aug. 13, 2020

(30) Foreign Application Priority Data
Sep. 1, 2017 (JP) .............................. JP2017-168814

(51) Int. Cl.
*H01L 47/00* (2006.01)
*H01L 45/00* (2006.01)
(Continued)

(52) U.S. Cl.
CPC ............ *H01L 45/1253* (2013.01); *G11C 7/18* (2013.01); *G11C 8/14* (2013.01); *H01L 27/2463* (2013.01); *H01L 45/16* (2013.01)

(58) Field of Classification Search
CPC .............. H01L 27/0688; H01L 27/101; H01L 27/2418; H01L 27/2463; H01L 45/1253;
(Continued)

(56) References Cited

U.S. PATENT DOCUMENTS

| 2011/0186803 | A1* | 8/2011 | Rinerson | ............ G11C 13/0069 257/5 |
| 2012/0099367 | A1* | 4/2012 | Azuma | ............ G11C 13/0007 365/148 |
| 2017/0179385 | A1* | 6/2017 | Shifren | ............... H01L 27/2463 |

FOREIGN PATENT DOCUMENTS

| JP | 2007-226884 A | 9/2007 |
| JP | 2008-288372 A | 11/2008 |

(Continued)

OTHER PUBLICATIONS

International Preliminary Report on Patentability dated Mar. 12, 2020 in corresponding International Application No. PCT/JP2018/031369.
(Continued)

*Primary Examiner* — Brook Kebede
(74) *Attorney, Agent, or Firm* — Ostrolenk Faber LLP

(57) ABSTRACT

A nonvolatile memory device includes a semiconductor substrate, a memory array region including a plurality of word lines formed linearly along a plane having a height (h1), a plurality of linear bit lines formed linearly along a plane having a height (h2) in a direction intersecting the plurality of word lines, and a plurality of memory cells provided between an intersection portion of each of the plurality of word lines with the plurality of bit lines and each of the plurality of bit lines, and a peripheral circuit region including a plurality of linear electrodes formed linearly along a plane having a height (h1), a plurality of linear electrodes formed linearly along a plane having the height (h2) in a direction intersecting the plurality of linear elec-
(Continued)

trodes, and an insulators provided at least between the plurality of linear electrodes and the plurality of linear electrodes.

9 Claims, 12 Drawing Sheets

(51) Int. Cl.
  *G11C 7/18* (2006.01)
  *G11C 8/14* (2006.01)
  *H01L 27/24* (2006.01)

(58) Field of Classification Search
  CPC ....... H01L 27/2481; H01L 45/16; G11C 7/18; G11C 8/14; G11C 13/0007; G11C 13/0023; G11C 13/003; G11C 13/0069
  USPC .......................................................... 257/4

See application file for complete search history.

(56) References Cited

FOREIGN PATENT DOCUMENTS

| JP | 2010-219282 A | 9/2010 |
| JP | 2011-258679 A | 12/2011 |
| JP | 2012-151514 A | 8/2012 |
| JP | 2012-204394 A | 10/2012 |
| JP | 2013-520013 | 5/2013 |
| JP | 2016-100387 A | 5/2016 |
| KR | 10-2006-0060596 A | 6/2006 |
| KR | 10-2009-0122139 A | 11/2009 |
| KR | 10-2012-0087079 A | 8/2012 |
| WO | WO 2011/100138 A2 | 8/2011 |

OTHER PUBLICATIONS

International Search Report dated Nov. 6, 2018 in corresponding International Application No. PCT/JP2018/031369.
Tanaka, T. et al.: "A 768Gb 3b/cell 3D-floating-gate NAND flash memory", ISSCC digest of technical papers, 2016, *IEEE International Solid-State Conference*, pp. 142-144.
Notice of Allowance dated Sep. 28, 2021 in counterpart Korean Application No. 10-2020-7005043.

* cited by examiner

*Fig.10*
(a)
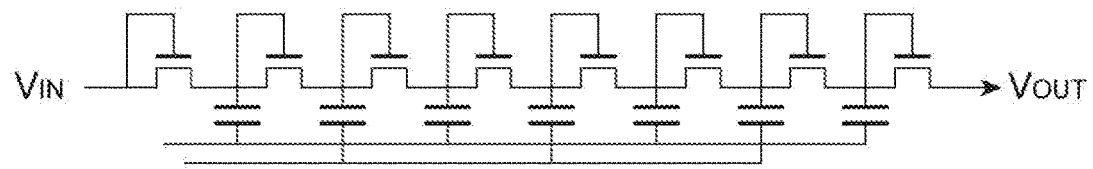
(b)
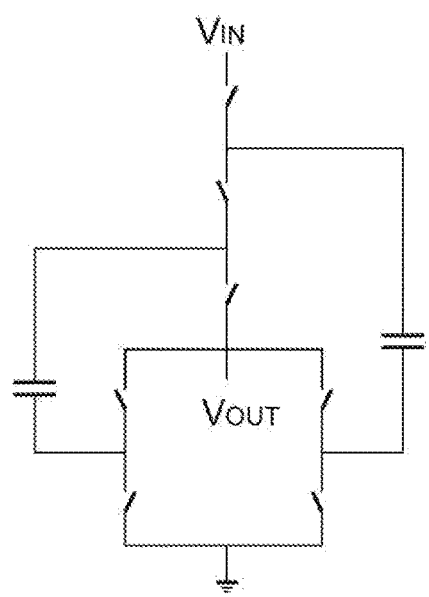
(c)
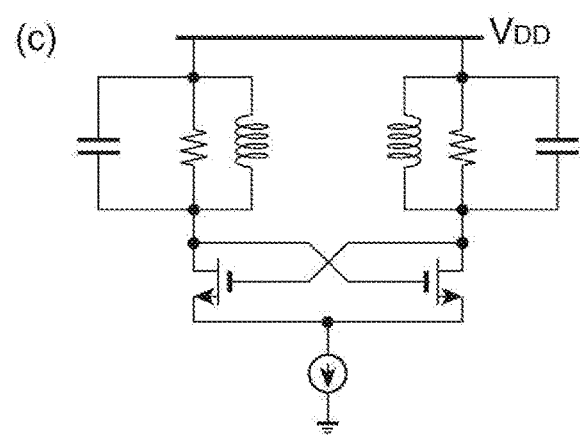

SEMICONDUCTOR DEVICE AND MANUFACTURING METHOD FOR SAME

CROSS-REFERENCE TO RELATED APPLICATIONS

The present application is a 35 U.S.C. §§ 371 national phase conversion of International Application No. PCT/JP2018/031369, filed Aug. 24, 2018, which claims priority to Japanese Patent Application No. 2017-168814, filed Sep. 1, 2017, the contents of both of which are incorporated herein by reference. The International Application was published in the Japanese language.

TECHNICAL FIELD

One aspect of the present invention relates to a semiconductor device and a method for manufacturing the same.

BACKGROUND ART

In recent years, a cross-point nonvolatile memory has been used as a storage element capable of efficiently increasing a storage capacity with a limited circuit area. A cross-point memory cell described in Patent Literature 1 below includes a word line which extends in a first direction, a bit line which extends in a second direction, and a memory cell including a capacitor which holds a capacitance state disposed at a position at which the bit line and the word line intersect. In addition, the following Non-Patent Literature discloses a "CMOS under array" technology for laminating a 3D NAND flash memory array in a circuit area.

CITATION LIST

Patent Literature

[Patent Literature 1] Japanese Unexamined Patent Application Publication No. 2013-520013
[Non-Patent Literature 1] T. Tanaka et al., "A 768 Gb 3b/cell 3D-floating-gate NAND flash memory," ISSCC digest of technical papers, pp. 142-144, December 2016

SUMMARY OF INVENTION

Technical Problem

In the above-described cross-point nonvolatile memory, it is necessary to additionally provide a circuit including a capacitor for a boosting circuit which boosts a voltage applied to a memory cell or for stabilizing a power supply voltage around the memory cell. Therefore, in the conventional cross-point nonvolatile memory, the circuit area tends to increase as the storage capacity increases.

In the past, since the memory array and the area of the peripheral circuits were independent, a chip size was a sum of sizes thereof. However, in the "CMOS under array" technology, since the peripheral circuits including the capacitor are allowed to be placed below the memory array, the chip size is determined only by the memory array, and as a result, the chip size is reduced. However, in the "CMOS under array" technology, since the capacitor used in a power supply circuit has a capacitor structure in which a gate oxide film of a conventional transistor is used as an insulating film, when the required capacitance increases, the chip size tends to be determined not by the memory array but by the peripheral circuits. That is, when the number of laminated layers is increased to increase the memory capacity, the area of the peripheral circuits is increased in proportion to the number, and the area may be larger than that of the memory array. Therefore, there is a problem that when the peripheral circuits are intended to be accommodated in an area of a lower layer of the memory array, there is a limit to the number of laminations, and further lamination cannot be performed.

One aspect of the present invention has been made in view of the above problem, and an object thereof is to provide a semiconductor device and a method for manufacturing the same, which are able to curb an increase in a circuit area.

Solution to Problem

In order to solve the above problem, a semiconductor device according to one embodiment of the present invention includes a semiconductor substrate, a first region including a plurality of first wiring portions formed linearly to be parallel to each other along a first surface having a first height on the semiconductor substrate, a plurality of second wiring portions formed linearly along a second surface having a second height on the semiconductor substrate in a direction intersecting the plurality of first wiring portions, and a plurality of storage elements provided to be connected to the first wiring portion and the second wiring portion between an intersection portion of each of the plurality of first wiring portions with the plurality of second wiring portions when seen from a direction perpendicular to the first surface and each of the plurality of second wiring portions, and a second region including a plurality of third wiring portions formed linearly to be parallel to each other along the first surface on the semiconductor substrate, a plurality of fourth wiring portions formed linearly along the second surface on the semiconductor substrate in a direction intersecting the plurality of third wiring portions, and an insulator disposed at least between the third wiring portion and the fourth wiring portion.

Alternatively, a method for manufacturing a semiconductor device according to another embodiment of the present invention includes a first layer forming step of linearly forming a plurality of first wiring portions to be parallel to each other in a first region along a first surface having a first height on a semiconductor substrate and linearly forming a plurality of third wiring portions to be parallel to each other in a second region along the first surface on the semiconductor substrate, a second layer forming step of forming a plurality of storage elements to be separately connected to the first wiring portions on each of the plurality of first wiring portions and forming an insulator on each of the plurality of third wiring portions, and a third layer forming step of linearly forming a plurality of second wiring portions in a direction intersecting the plurality of first wiring portions in a region corresponding to the first region along a second surface having a second height on the semiconductor substrate and connected to the plurality of storage elements and linearly forming a plurality of fourth wiring portions in a direction intersecting the plurality of third wiring portions in a region corresponding to the second region along the second surface on the semiconductor substrate with the insulator sandwiched between the plurality of third wiring portions and the plurality of fourth wiring portions.

According to the semiconductor device of the aspect or the method for manufacturing the same, the semiconductor device is constituted with a first region including a plurality of first wiring portions formed linearly, a plurality of second wiring portions formed linearly in the direction intersecting the plurality of first wiring portions, and a plurality of storage elements connected between the plurality of first wiring portions and the plurality of second wiring portions, and a second region including a plurality of third wiring portions formed linearly along the same plane as the first wiring portions, a plurality of fourth wiring portions formed linearly along the same plane as the second wiring portions in a direction intersecting the plurality of third wiring portions, and an insulator sandwiched between the plurality of third wiring portions and the plurality of fourth wiring portions. Therefore, even when the number of laminated first regions constituting the storage element array is increased to increase a storage capacity, a capacitance of a capacitor included in the second region can be increased accordingly, and thus an increase in a circuit area of the second region can be curbed. As a result, miniaturization and cost reduction of the entire circuit can be easily realized.

Advantageous Effects of Invention

According to one embodiment of the present invention, a semiconductor device and a method for manufacturing the same, which can curb an increase in a circuit area, can be provided.

BRIEF DESCRIPTION OF DRAWINGS

FIG. 10 is a circuit diagram showing an example of a circuit configuration realized in the peripheral circuit region 7.

DESCRIPTION OF EMBODIMENTS

Figure 1:
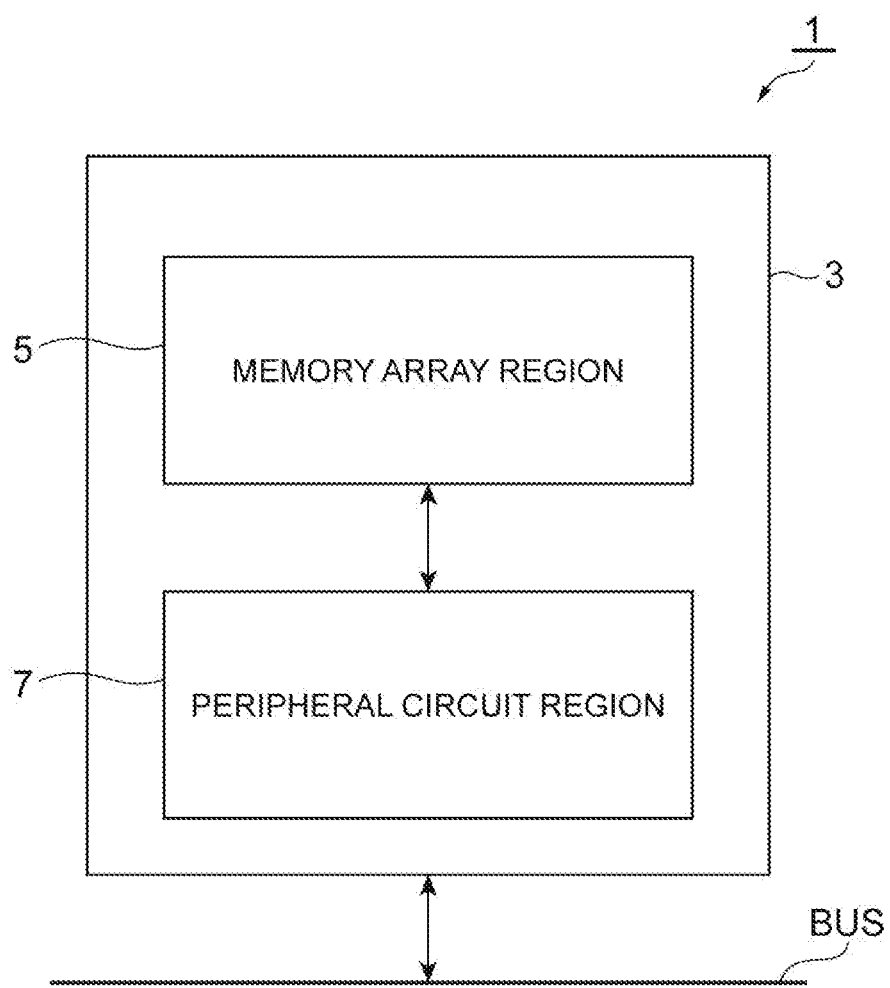
FIG. 1 is a diagram showing a schematic configuration of a nonvolatile memory device according to a preferred embodiment of the present invention.

Hereinafter, a preferred embodiment of a semiconductor device according to the present invention will be described in detail with reference to the drawings. In the description of the drawings, the same or corresponding parts will be designated by the same reference numerals, and redundant description will be omitted.

As shown in FIG. 1, a nonvolatile memory device 1 which is a semiconductor device according to a preferred embodiment of the present invention includes a semiconductor substrate 3 such as a silicon substrate, and a memory array region (a first region) 5 and a peripheral circuit region (a second region) 7 formed on the semiconductor substrate 3. The memory array region 5 is connected via the peripheral circuit region 7 to an external bus BUS to enable data communication and has a function of retaining data according to a signal received via the external bus BUS. The peripheral circuit region 7 includes an arithmetic processing unit which performs various arithmetic operations, a memory unit which stores a variety of data, a control circuit which controls writing and reading of data in the memory array region 5, a communication circuit which communicates with the outside via a bus BUS, and the like. The control circuit included in the peripheral circuit region 7 controls writing of data to a memory cell (which will be described in detail later) of a specified address in the memory array region 5 based on a signal received from the bus BUS. Further, the control circuit included in the peripheral circuit region 7 controls reading of data from a memory cell of a specified address in the memory array region 5 based on a signal received from the bus BUS. Furthermore, the control circuit has a function of boosting a power supply voltage input from the outside and applying the boosted power supply voltage to a memory cell to write or read data.

Figure 2:
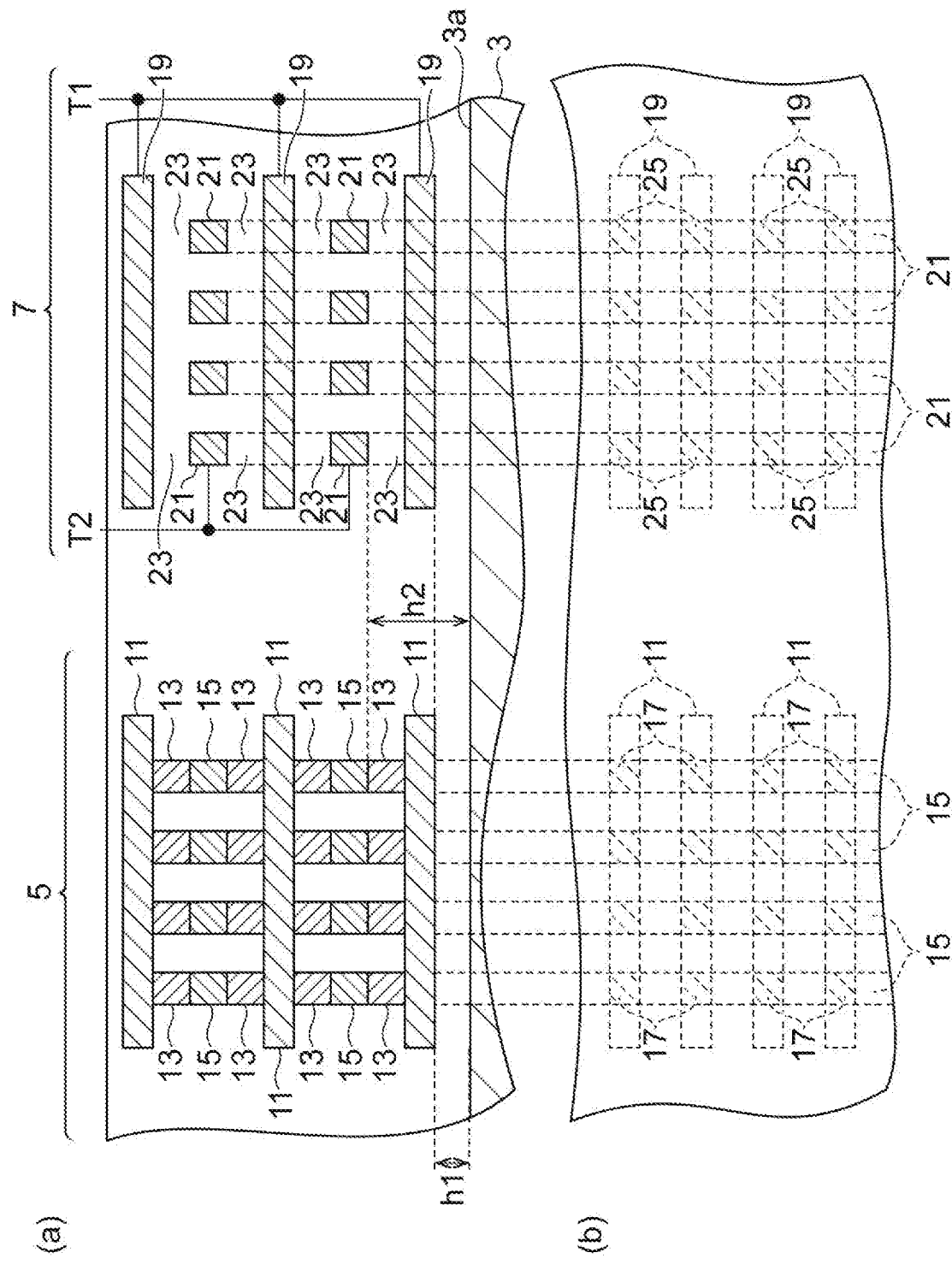
FIG. 2 is a cross-sectional view and a plan view showing a detailed structure of the nonvolatile memory device 1.

Next, a detailed configuration of the memory array region 5 and the peripheral circuit region 7 of the nonvolatile memory device 1 will be described. In FIG. 2, a portion (a) is a cross-sectional view along a plane perpendicular to a main surface of the semiconductor substrate 3 of the nonvolatile memory device 1, and a portion (b) is a plan view of the nonvolatile memory device 1 seen from a direction perpendicular to the main surface of the semiconductor substrate 3.

The memory array region 5 is constituted by a structure including a plurality of word lines (first wiring portions) 11, a plurality of bit lines (second wiring portions) 15, and a plurality of memory cells (storage elements) 13 sandwiched between the word lines 11 and the bit lines 15 and laminated in four layers. Specifically, the plurality of word lines 11 are metal films made of tungsten (W), copper (Cu), aluminum (Al), polycrystalline silicon (Poly-Si), or an alloy thereof and are formed linearly to be parallel to each other at a predetermined pitch along a plane of a height h1 on a main surface 3a of the semiconductor substrate 3. The plurality of bit lines 15 are metal films made of tungsten (W), copper (Cu), aluminum (Al), polycrystalline silicon (Poly-Si), or an alloy thereof and are formed linearly to be parallel to each other at a predetermined pitch along a plane of a height h2 (>h1) on the main surface 3a of the semiconductor substrate 3 and to extend in a direction perpendicular to a direction in which the word lines 11 are formed. The memory cell 13 is a storage element formed between each of the plurality of bit lines 15 and an intersection portion 17 of each of the plurality of word lines 11 with the plurality of bit lines 15 when seen in the direction perpendicular to the main surface 3a. The memory cell 13 may be a resistive RAM, a phase change memory, a magnetic RAM, a spin memory, or the like. The memory cells 13 are connected to the corresponding word lines 11 and bit lines 15 at both ends in a direction perpendicular to the main surface 3a. Each of the addresses of such memory cells 13 is determined by the connected word line 11 and bit line 15.

Further, in the memory array region 5, a layer of the memory cell 13 and a layer of the word line 11 are further laminated on a laminated structure including the layer of the word line 11, the layer of the memory cell 13, and the layer of the bit line 15 as described above. Thus, a plurality of layers of the memory cells 13 sandwiched between a plurality of layers of the word lines 11 and a plurality of layers of the bit lines 15 are further laminated. A total of four layers of the memory cells 13 connected to the word lines 11 and the bit lines 15 are formed by similarly laminating two more layers of the memory cells 13. The embodiment has a structure in which four layers of the memory cells 13 are laminated, but the number of layers is not limited to a specific number.

The peripheral circuit region 7 is constituted by a structure including a plurality of linear electrodes (third wiring portions) 19, a plurality of linear electrodes (fourth wiring portions) 21, and insulators 23 sandwiched between the linear electrodes 19 and the linear electrodes 21 and laminated in four layers. Specifically, the plurality of linear electrodes 19 are metal films made of tungsten (W), copper (Cu), aluminum (Al), polycrystalline silicon (Poly-Si), or an alloy thereof and are formed linearly to be parallel to each other at a predetermined pitch along a plane of a height h1 on the main surface 3a of the semiconductor substrate 3 and to extend in the same direction in which the word lines 11 are formed. The plurality of linear electrodes 21 are metal films made of tungsten (W), copper (Cu), aluminum (Al), polycrystalline silicon (Poly-Si), or an alloy thereof and are formed linearly to be parallel to each other at a predetermined pitch along a plane of a height h2 (>h1) on the main surface 3a of the semiconductor substrate 3, to extend in a direction perpendicular to a direction in which the linear electrodes 19 are formed and to extend in the same direction in which the bit lines 15 are formed. Each of the insulators 23 is an insulator at least made of silicon dioxide ($SiO_2$), silicon nitride ($Si_3N_4$) or the like and formed between each of the plurality of linear electrodes 21 and an intersection portion 25 of each of the plurality of linear electrodes 19 with the plurality of linear electrodes 21 when seen in the direction perpendicular to the main surface 3a. In the embodiment, the insulator 23 is formed over the entire memory array region 5 and peripheral circuit region 7 except for the word lines 11, the bit lines 15, the memory cells 13, and the linear electrodes 19 and 21. Here, the insulator 23 may be formed separately in the memory array region 5 and the peripheral circuit region 7, and in this case, insulators made of different materials may be Ruined in the memory array region 5 and the peripheral circuit region 7. In addition, the insulators 23 may be formed only at the intersection portions 25 between the linear electrodes 19 and the linear electrodes 21 in the peripheral circuit region 7.

Here, the plurality of linear electrodes 19 are not necessarily limited to those formed in the same direction in which the word lines 11 are formed. For example, some of the plurality of linear electrodes 19 may be formed in the same direction in which the word lines 11 are formed, and the others of the plurality of linear electrodes 19 may be formed in a direction (for example, a vertical direction) different from the direction in which the word lines 11 are formed. Similarly, the plurality of linear electrodes 21 are not necessarily limited to those formed in the same direction in which the bit lines 15 are formed. For example, some of the plurality of linear electrodes 21 may be formed in the same direction in which the bit lines 15 are formed, and the others of the plurality of linear electrodes 21 may be formed in a direction (for example, a vertical direction) different from the direction in which the bit lines 15 are formed.

Further, a length of each of the plurality of linear electrodes 19 is preferably shorter than that of each of the word lines 11. Generally, while it is necessary to increase an area of a memory array by extending a wiring length of the word lines 11 as much as possible, an RC time constant determined by the product of a parasitic resistance and a capacitance increases as the wiring length of the linear electrodes 19 increases, and thus when an operating frequency decreases, an output current of a capacitor formed by the linear electrodes 19 decreases. Thus, it is necessary to reduce the RC time constant by making the length of the plurality of linear electrodes 19 shorter than that of the word lines 11. For the same reason, the length of the plurality of linear electrodes 21 is preferably shorter than that of the bit lines 15.

Further, in the peripheral circuit region 7, a layer of the insulator 23 and a layer of the linear electrode 19 are further laminated on a laminated structure constituted by a layer of the linear electrode 19, a layer of the insulator 23, and a layer of the linear electrode 21. Thus, the layer of the insulator 23 sandwiched between the layer of the linear electrode 19 and the layer of the linear electrode 21 is further laminated. A total of four layers of the insulator 23 sandwiched between the linear electrodes 19 and 21 are formed by similarly further laminating two layers of the insulator 23. The embodiment has a structure in which four layers of the insulators 23 are laminated, but the number of layers is not limited to a specific number.

In the peripheral circuit region 7 having such a configuration, the three-layered plural linear electrodes 19 are commonly electrically connected to an external terminal T1, and the two-layered plural linear electrodes 21 are commonly electrically connected to an external terminal T2. Thus, a plurality of capacitors formed by the linear electrodes 19 and 21 and the insulators 23 at a plurality of intersection portions 25 can be connected in parallel between the external terminals T1 and T2, and the capacitance of the capacitor realized in the peripheral circuit region 7 can be efficiently increased.

A material of the word lines 11 and the bit lines 15 in the memory array region 5 and a material of the linear electrodes 19 and 21 in the peripheral circuit region 7 are preferably the same. In this case, processes of forming the word lines 11 and the linear electrodes 19 and processes of forming the bit lines 15 and the linear electrodes 21 can be simplified. Further, a line width and an arrangement pitch of the linear electrodes 19 along the main surface 3a are preferably larger than those of the word lines 11 along the main surface 3a. Furthermore, a line width and an arrangement pitch of the linear electrodes 21 along the main surface 3a are preferably larger than those of the bit lines 15 along the main surface 3a.

Next, a method for manufacturing the nonvolatile memory device 1 will be described. FIGS. 3 to 6 are cross-sectional views along a plane perpendicular to the main surface of the semiconductor substrate 3 showing processes of manufacturing the nonvolatile memory device 1.

Figure 3:
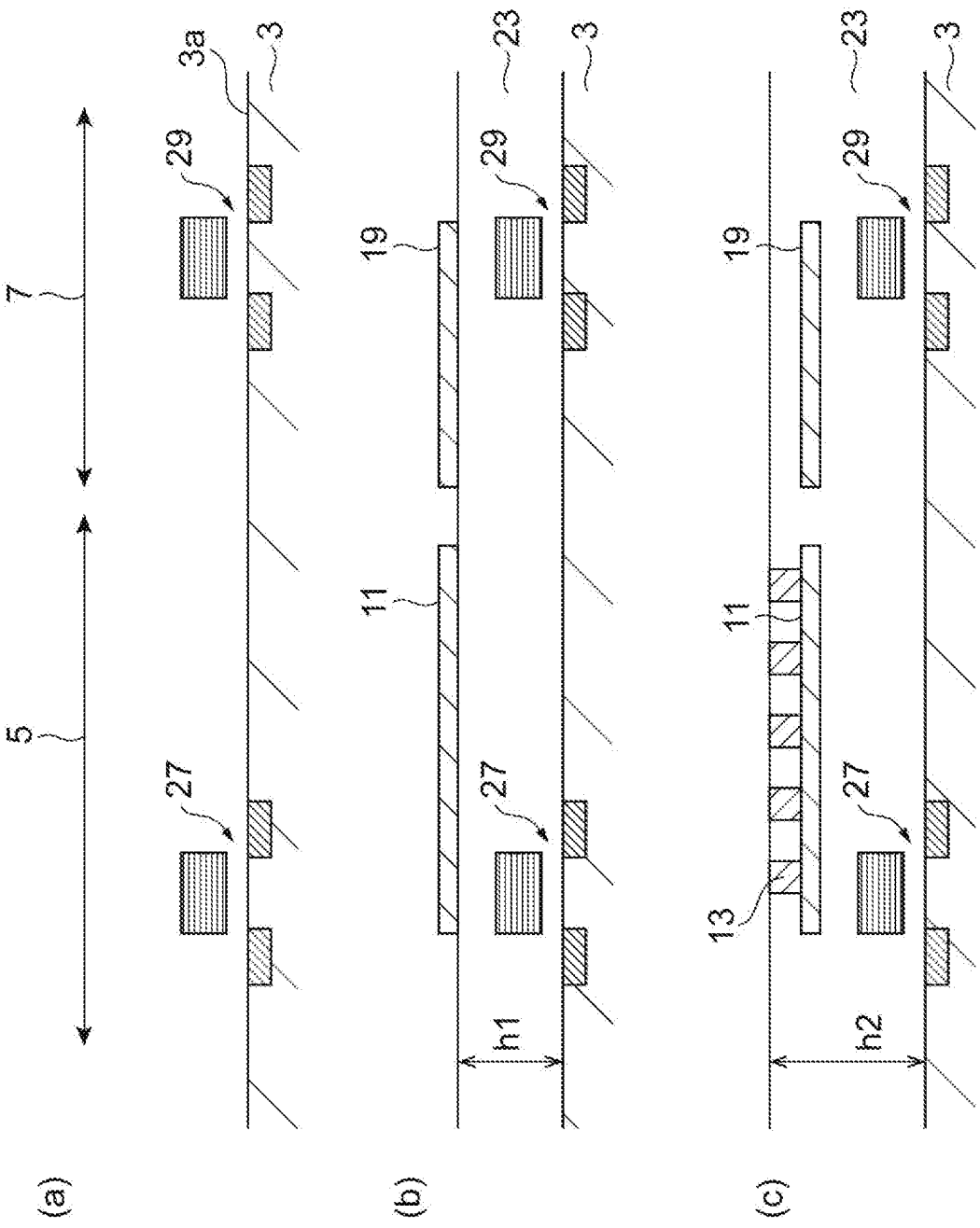
FIG. 3 is a cross-sectional view along a plane perpendicular to a main surface of a semiconductor substrate 3 showing a process of manufacturing the nonvolatile memory device 1.

First, a transistor 27 for writing or reading on a memory cell is formed in the memory array region 5 in the vicinity of the main surface 3a of the semiconductor substrate 3, and a transistor 29 for a control circuit for writing or reading on a memory cell is formed in the peripheral circuit region 7 in the vicinity of the main surface 3a (a portion (a) in FIG. 3). Then, after a layer of the insulator 23 is formed from the main surface 3a on the semiconductor substrate 3 to the plane of the height h1, a plurality of word lines 11 are formed in the memory array region 5 along a surface of the layer of the insulator 23 to be parallel to each other, and a plurality of linear electrodes 19 are formed in the peripheral circuit region 7 along a surface of the layer of the insulator 23 to be parallel to each other in the same direction in which the word lines 11 are formed (a portion (b) in FIG. 3, a first layer forming step).

Next, on each of the plurality of word lines 11 in the memory array region 5, after a plurality of memory cells 13 separated from each other are formed to be connected to the respective word lines 11, a layer of the insulator 23 is formed from the main surface 3a on the semiconductor substrate 3 to the plane of the height h2 to cover the memory cells 13 over the memory array region 5 and the peripheral circuit region 7 (a portion (c) in FIG. 3, a second layer forming step). Accordingly, the insulator 23 is formed on each of the plurality of linear electrodes 19 in the peripheral circuit region 7.

Then, a plurality of bit lines 15 are formed in the memory array region 5 along the surface of the layer of the insulator 23 having the height h2 to be perpendicular to a direction in which the plurality of word lines 11 are formed. At this time, the plurality of bit lines 15 are formed to be connected to upper surfaces of the respective memory cells 13 at the intersection portions 17 with the plurality of word lines 11 (the portion (b) in FIG. 2). At the same time, the plurality of linear electrodes 21 are formed in the peripheral circuit region 7 along the surface of the layer of the insulator 23 having the height h2 to be parallel to each other in the same direction in which the bit lines 15 are formed (a portion (a) in FIG. 4, a third layer forming step). Accordingly, the plurality of linear electrodes 21 are formed in a state in which the insulator 23 is interposed between the plurality of linear electrodes 21 and the plurality of linear electrodes 19 at the intersection portions 25 of linear electrodes 21 (the portion (b) in FIG. 2) with the plurality of linear electrodes 19.

Figure 4:
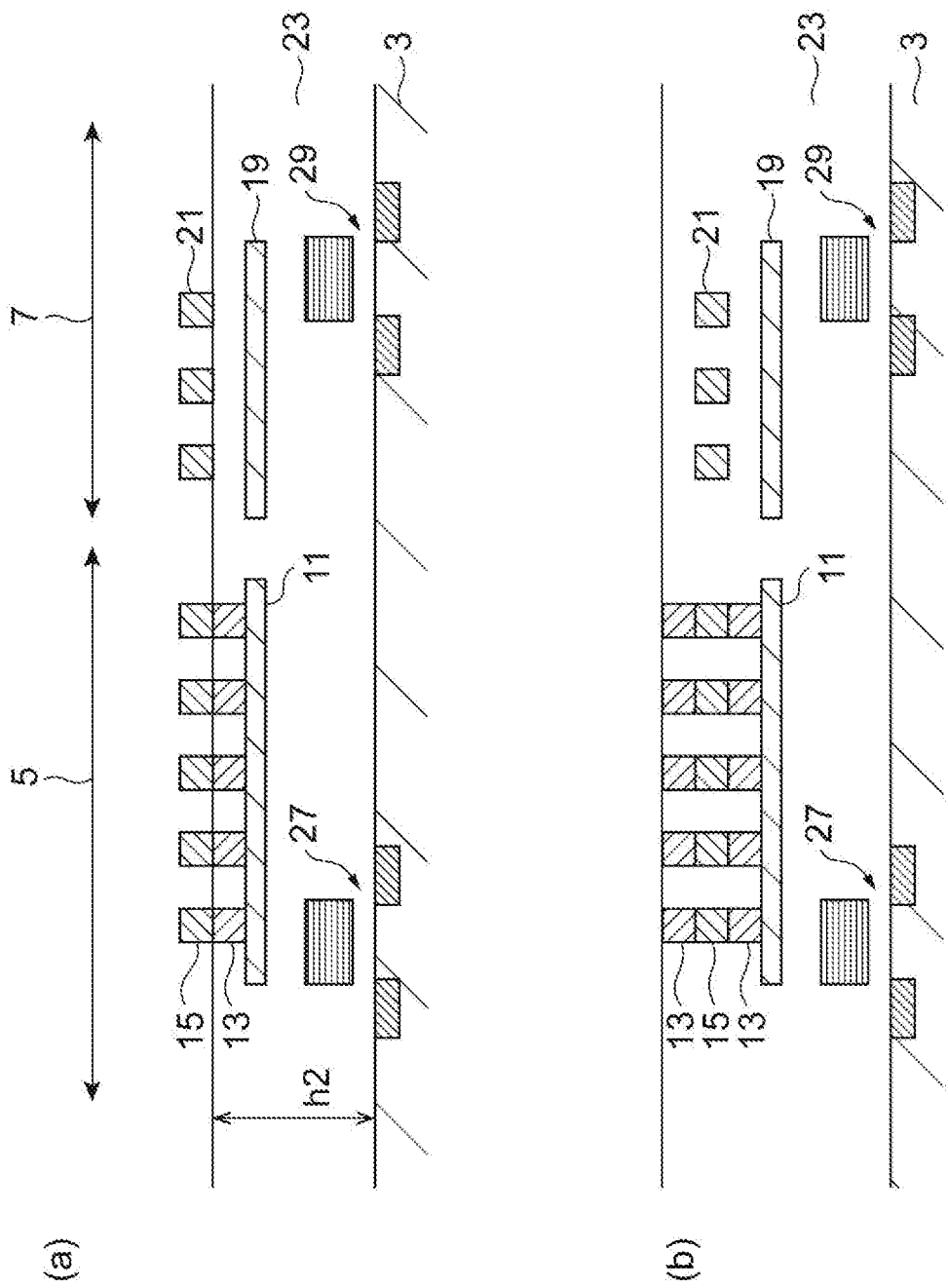
FIG. 4 is a cross-sectional view along a plane perpendicular to the main surface of the semiconductor substrate 3 showing the process of manufacturing the nonvolatile memory device 1.
Figure 5:
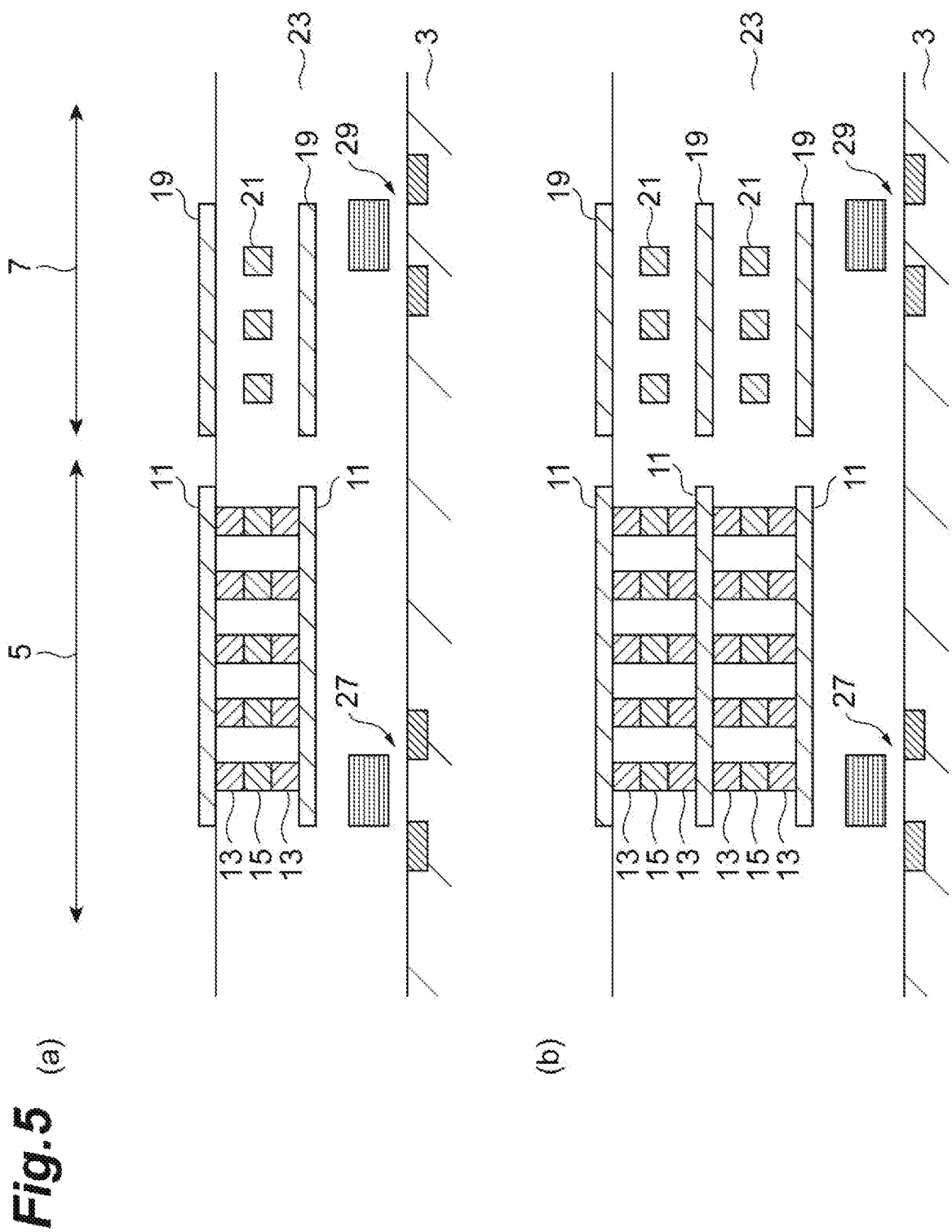
FIG. 5 is a cross-sectional view along a plane perpendicular to the main surface of the semiconductor substrate 3 showing the process of manufacturing the nonvolatile memory device 1.

Furthermore, the layer of the memory cell 13 and the layer of the insulator 23 are formed in the memory array region 5 and the peripheral circuit region 7 (a portion (b) in FIG. 4), and then the layer of the word line 11 and the layer of the linear electrode 19 are laminated on the memory array region 5 and the peripheral circuit region 7 (a portion (a) in FIG. 5) by the same procedure.

Thereafter, the layer of the memory cell 13, the layer of the bit line 15, the layer of the memory cell 13, and the layer of the word line 11 are laminated in that order on the memory array region 5, and the layer of the insulator 23, the layer of the linear electrode 21, the layer of the insulator 23, and the layer of the linear electrode 19 are laminated in that order on the peripheral circuit region 7 by repeating the same procedure (a portion (b) in FIG. 5). A total of four layers of the memory cells 13 connected to the word lines 11 and the bit lines 15 are formed in the memory array region 5 on the semiconductor substrate 3, and a total of four layers of the insulator 23 sandwiched between the linear electrodes 19 and the linear electrodes 21 are formed in the peripheral circuit region 7 on the semiconductor substrate 3 through the above-described processes.

Figure 6:
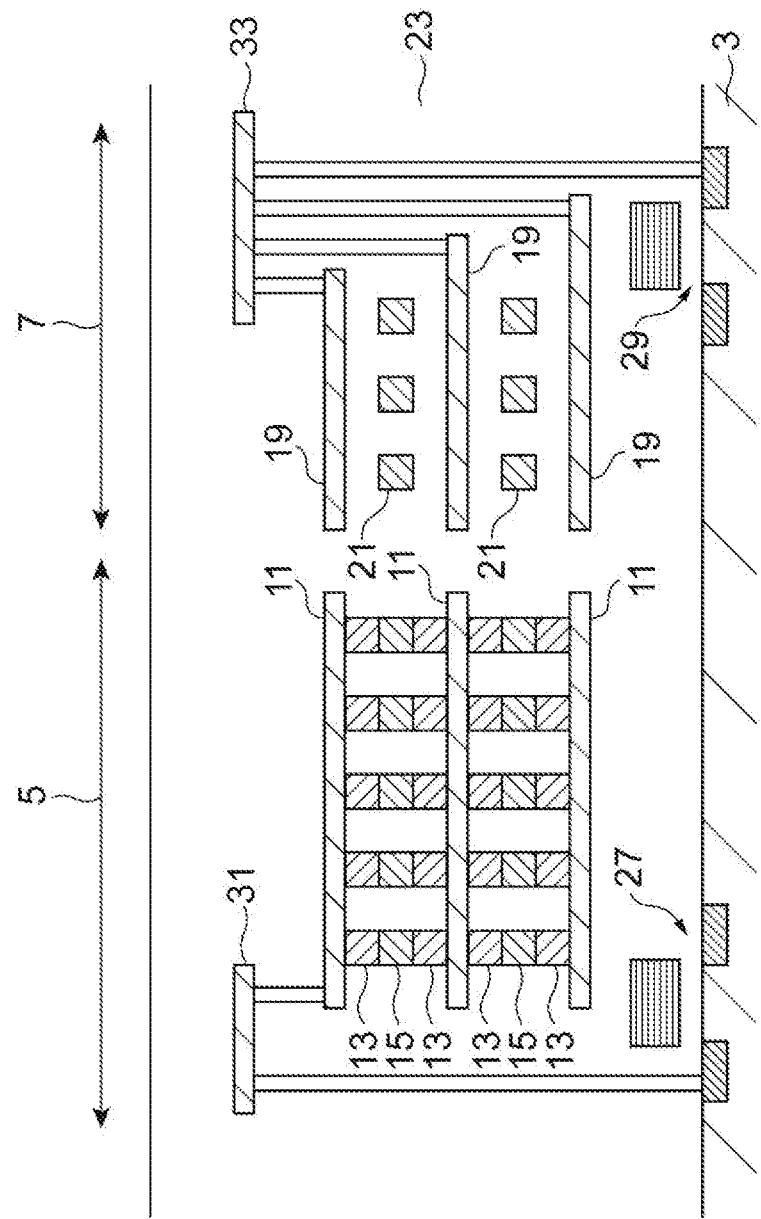
FIG. 6 is a cross-sectional view along a plane perpendicular to the main surface of the semiconductor substrate 3 showing the process of manufacturing the nonvolatile memory device 1.

Lastly, a wiring portion 31 for electrically connecting each of the word lines 11 and each of the bit lines 15 to a terminal of the transistor 27 is formed in the memory array region 5, and a wiring portion 33 for connecting each of the linear electrodes 19 and each of the linear electrodes 21 to a terminal of the transistor 29 is formed in the peripheral circuit region 7 (FIG. 6). In FIG. 6, only parts of the wiring portions 31 and 33 for the word lines 11 and the linear electrodes 19 are shown, and other parts of the wiring portions 31 and 33 are omitted.

Figure 7:
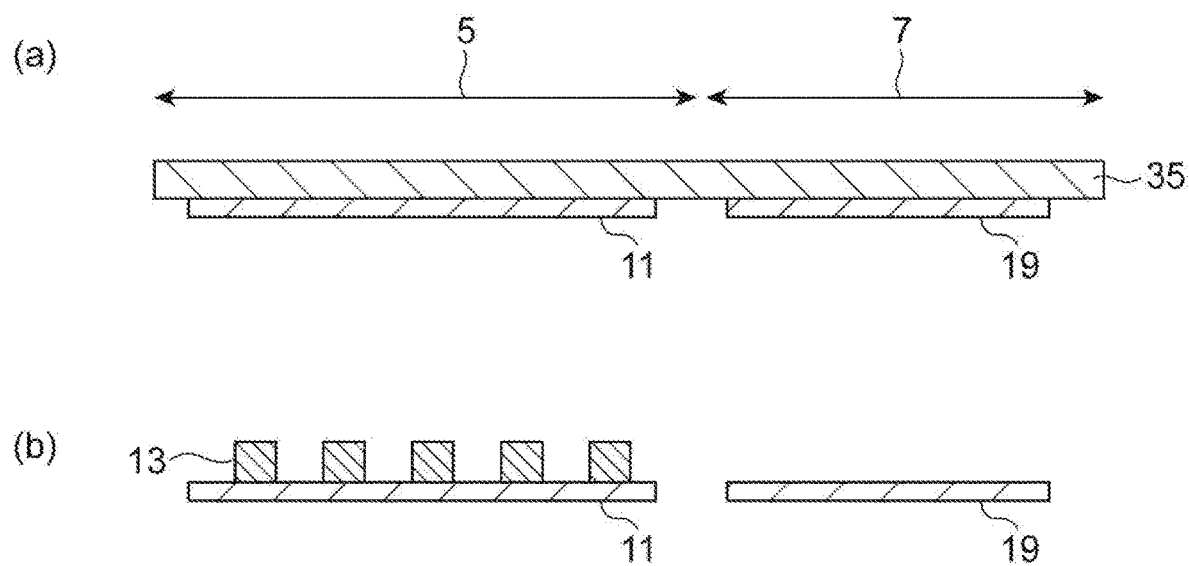
FIG. 7 is a cross-sectional view along a plane perpendicular to the main surface of the semiconductor substrate 3 showing a process of a two-layer forming step.
Figure 8:
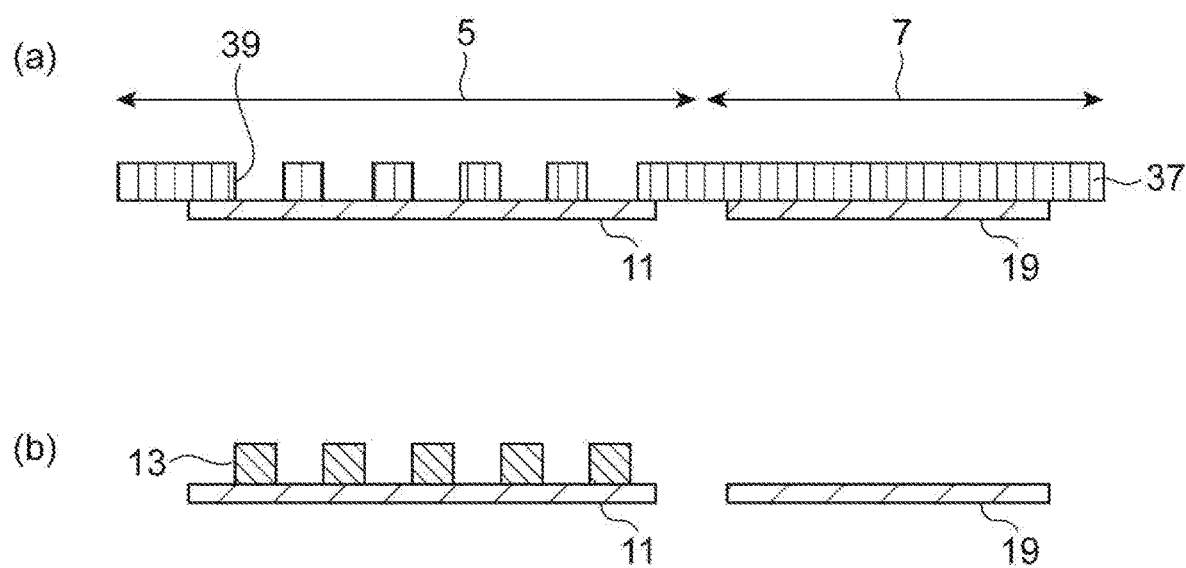
FIG. 8 is a cross-sectional view along a plane perpendicular to the main surface of the semiconductor substrate 3 showing the process of the two-layer forming step.

Here, details of the second layer forming step shown in the portion (c) of FIG. 3 will be described with reference to FIGS. 7 and 8. FIGS. 7 and 8 are cross-sectional views along a plane perpendicular to the main surface of the semiconductor substrate 3 showing a process of the second layer forming step. In the second layer forming step, one of the procedures shown in FIG. 7 or FIG. 8 is adopted.

In the procedure shown in FIG. 7, first, a layer of a storage element material 35 is formed on the surfaces of the word lines 11 and the linear electrodes 19 along the main surface 3a of the semiconductor substrate 3 to cover the memory array region 5 and the peripheral circuit region 7 (a portion (a) in FIG. 7). Next, the storage element material 35 in a portion of the memory array region 5 other than portions of the memory cells 13 is removed by an etching process, and the storage element material 35 in the entire peripheral circuit region 7 is removed (a portion (b) in FIG. 7). Thereafter, the layer of the insulator 23 is formed to cover the memory array region 5 and the peripheral circuit region 7.

Meanwhile, in the procedure shown in FIG. 8, first, a layer of a coating material 37 such as a silicon oxide film, a silicon nitride film, or a hard mask such as carbon is formed on the surfaces of the word lines 11 and the linear electrodes 19 along the main surface 3a of the semiconductor substrate 3 to cover the memory array region 5 and the peripheral circuit region 7 (a portion (a) in FIG. 8). Hole portions 39 are formed in a portion of the layer of the coating material 37 corresponding to the memory cell 13 in the memory array region 5. Next, a plurality of memory cells 13 are formed by embedding a storage element material in the hole portions 39 of the memory array region 5, and then the layer of the coating material 37 in the memory array region 5 and the peripheral circuit region 7 is removed (a portion (b) in FIG. 8). Then, the layer of the insulator 23 is formed to cover the memory array region 5 and the peripheral circuit region 7.

Figure 9:
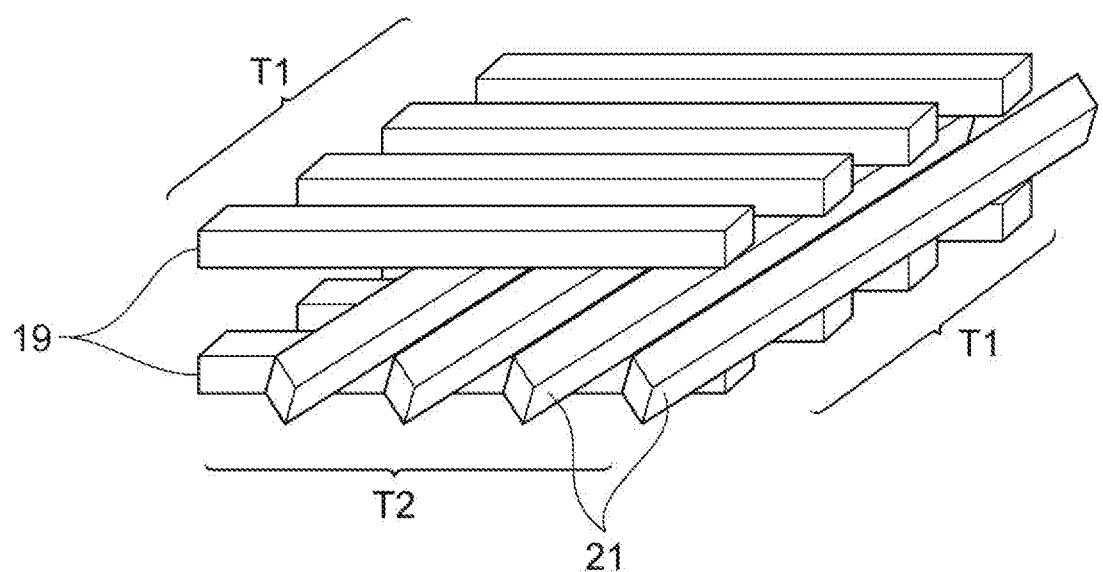
FIG. 9 is a perspective view showing a connection configuration of a capacitor formed by a peripheral circuit region 7.

A connection form of the capacitor formed by the peripheral circuit region 7 in the above-described nonvolatile memory device 1 will be described. FIG. 9 is a perspective view showing the connection form of the capacitor formed by the peripheral circuit region 7. As described above, in the peripheral circuit region 7, the plurality of linear electrodes 19 are commonly electrically connected to the external terminal T1, and the plurality of linear electrodes 21 are commonly electrically connected to the external terminal T2. Since each of the regions of the insulators sandwiched between the linear electrodes 19 and 21 forms a capacitor, a plurality of capacitors are connected in parallel between the two external terminals T1 and T2, and a composite capacitor having a large capacitance can be formed in a limited peripheral circuit region with such a connection form.

In the peripheral circuit region 7 of the nonvolatile memory device 1, circuits for various uses can be configured by forming a plurality of such composite capacitors. FIG. 10 shows an example of a circuit configuration realized in the peripheral circuit region 7. A portion (a) in FIG. 10 shows an example of a booster circuit which includes a capacitor and a transistor and boosts an input voltage $V_{IN}$ to an output voltage $V_{OUT}$. Also, a portion (b) in FIG. 10 shows an example of a step-down circuit which includes a capacitor and a switch element and steps down the input voltage $V_{IN}$ to the output voltage $V_{OUT}$. Also, a portion (c) in FIG. 10 shows an example of an oscillation circuit which includes a capacitor, an inductor, a resistor element, a transistor, and the like. In addition, the capacitor formed in the peripheral circuit region 7 of the nonvolatile memory device 1 may be used as a capacitor (a decoupling capacitor) for stabilizing a power supply.

The above-described nonvolatile memory device 1 is constituted with the memory array region 5 including the plurality of word lines 11 which are formed linearly, the plurality of linear bit lines 15 which are formed linearly and extend in a direction intersecting the plurality of word lines 11, and the plurality of memory cells 13 connected between the plurality of word lines 11 and the plurality of bit lines 15, and the peripheral circuit region 7 including the plurality of linear electrodes 19 which are formed linearly along the same plane as the word lines 11, the linear electrodes 21 which are formed linearly and extend along the same plane as the bit lines 15 in a direction intersecting the plurality of linear electrodes 19, and the insulators 23 sandwiched between the plurality of linear electrodes 19 and the plurality of linear electrodes 21. Therefore, even when the number of laminated memory array regions 5 constituting the memory cells 13 increases to increase the storage capacity (the number of bits) per unit area, the capacitance of the capacitor included in the peripheral circuit region 7 can be increased accordingly. Thus, an increase in a circuit area of the peripheral circuit region 7 can be curbed. For example, a voltage supply capability of the booster circuit for boosting a voltage applied to the memory cell 13 can be increased by increasing the capacitance of the capacitor. As a result, miniaturization and cost reduction of the entire circuit can be easily realized.

Figure 11:
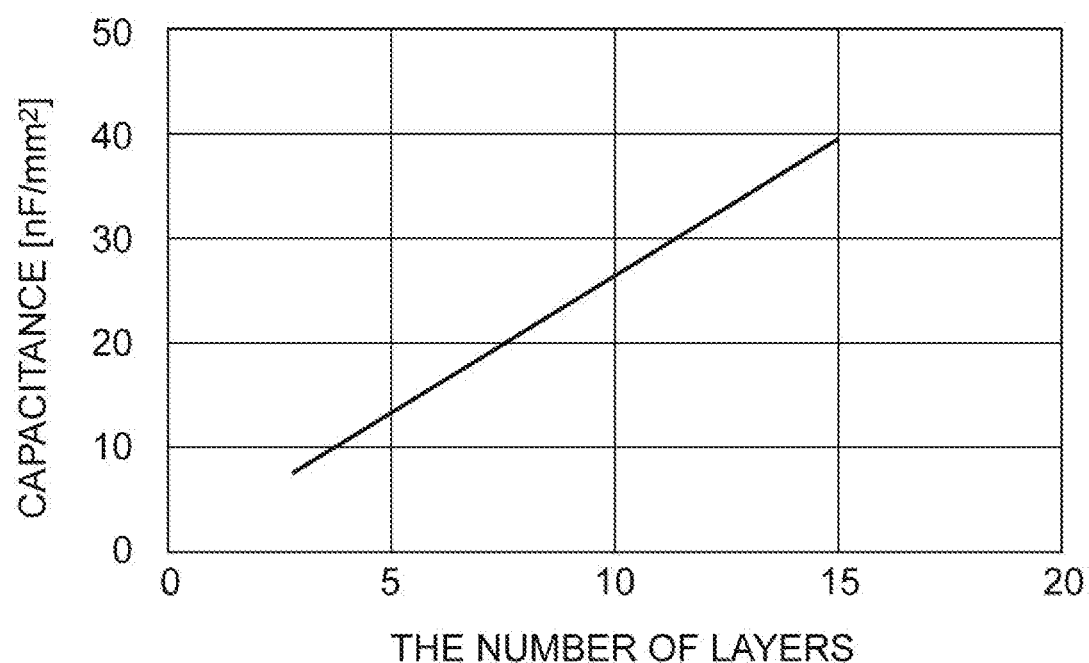
FIG. 11 is a graph showing a relationship between a capacitance per unit area of a capacitor generated by the nonvolatile memory device 1 and the number of layers.

FIG. 11 shows results of calculating a relationship between the capacitance per unit area of the capacitor generated by the nonvolatile memory device 1 and the number of layers. Here, assuming a case in which a line width of each of the plurality of linear electrodes 19 and 21 along the main surface 3a is 20 nm, an arrangement pitch of each of the plurality of linear electrodes 19 and 21 along the main surface 3a is 40 nm, a thickness of the plurality of linear electrodes 19 and 21 in the direction perpendicular to the main surface 3a is 40 nm, and a thickness of each of the insulators 23 sandwiched between the linear electrodes 19 and 21 in the direction perpendicular to the main surface 3a is 40 nm, a theoretical value of the capacitance value per unit area [nF/mm$^2$] when the total number of layers of the linear electrode 19 and the linear electrode 21 is changed. As shown in the calculation results, in a case of five layers corresponding to the structure shown in FIG. 2, the capacitance value per unit area is about 12 to 13 nF/mm$^2$. This shows that a large capacitance value can be obtained as compared with a capacitance value of 8 nF/mm$^2$ of the transistor having a gate oxide film with a thickness of 4 nm. It can also be understood that a larger capacitance value can be obtained in proportion to the number of layers.

Here, the plurality of linear electrodes 19 are formed in the same direction as the plurality of word lines 11, and the plurality of linear electrodes 21 are formed in the same direction as the plurality of bit lines 15. In this case, the peripheral circuit region 7 is formed efficiently, and thus cost of the entire circuit can be reduced.

Further, the plurality of linear electrodes 19 are commonly electrically connected to the external terminal T1, and the plurality of linear electrodes 21 are commonly electrically connected to the external terminal T2. Due to such a connection form, a large-capacitance capacitor can be formed by connecting the capacitances of the capacitors formed by the peripheral circuit region 7 in parallel.

Further, the line width or interval of the plurality of linear electrodes 19 along the main surface 3a of the semiconductor substrate 3 is larger than that of the plurality of word lines 11. Also, the line width or interval of the plurality of linear electrodes 21 along the main surface 3a of the semiconductor substrate 3 is larger than that of the plurality of bit lines 15. According to such a configuration, the probability of short-circuiting between the wirings of the adjacent capacitors can be reduced, or the probability of defective capacitors can be reduced by increasing a distance between wirings of the capacitors fixated in the peripheral circuit region 7. In addition, a large capacitance of the capacitor can be realized by designing the region differently from the memory array region 5. However, the line width or interval of the plurality of linear electrodes 19 along the main surface 3a of the semiconductor substrate 3 may be the same as that of the plurality of word lines 11, and the line width or interval of the plurality of linear electrodes 21 along the main surface 3a of the semiconductor substrate 3 may be the same as that of the plurality of bit lines 15. In this case, processing of the nonvolatile memory device 1 becomes easy, and a yield can be increased.

Further, in the second layer forming step which is a manufacturing process of the nonvolatile memory device 1, the plurality of memory cells 13 are formed by forming the storage element material 35 along the main surface 3a of the semiconductor substrate 3 and etching the storage element material 35 in the memory array region 5, and the insulator 23 is formed in the peripheral circuit region 7 after the storage element material 35 in the peripheral circuit region 7 is removed. In this way, the formation of the plurality of memory cells 13 in the memory array region 5 and the formation of the insulator 23 constituting the capacitor in the peripheral circuit region 7 can be performed efficiently.

Alternatively, in the second layer forming step which is a manufacturing process of the nonvolatile memory device 1, the plurality of memory cells 13 are formed by forming the coating material 37 having the hole portions 39 along the main surface 3a of the semiconductor substrate 3 and embedding the storage element material in the hole portions 39 of the coating material 37 in the memory array region 5, and the insulator 23 is formed in the peripheral circuit region 7 after the coating material 37 in the peripheral circuit region 7 is removed. In this way, the formation of the plurality of memory cells 13 in the memory array region 5 and the formation of the insulator 23 constituting the capacitor in the peripheral circuit region 7 can be performed efficiently.

The present invention is not limited to the above-described embodiment. The configuration of the above-described embodiment may be variously changed.

Figure 12:
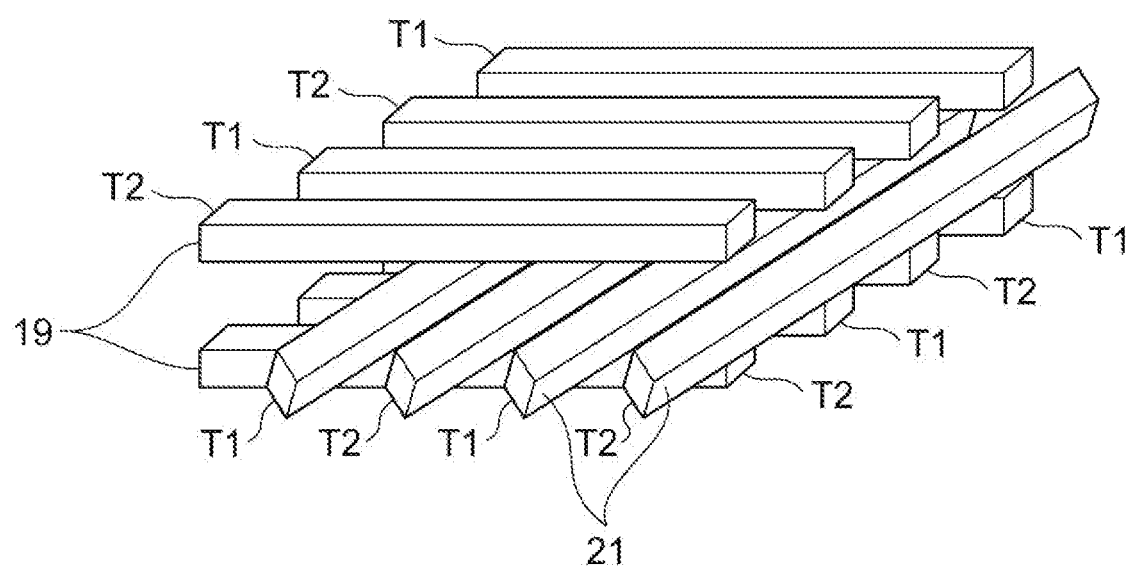
FIG. 12 is a perspective view showing a connection configuration of the capacitor formed by the peripheral circuit region 7 in a modified example of the present invention.

In the above-described embodiment, as shown in FIG. 12, the plurality of linear electrodes 19 having the same layers may be electrically connected alternately to the external terminals T1 and T2, and the plurality of linear electrodes 21 having the same layers may be electrically connected alternately to the external terminals T1 and T2. Even with such a configuration, a large-capacitance capacitor can be formed by connecting the capacitances of the capacitors formed by the peripheral circuit region 7 in parallel. In this case, the capacitors formed by the insulator 23 sandwiched between two linear electrodes 19 adjacent in a direction along the main surface 3a and between two linear electrodes 21 adjacent in the direction along the main surface 3a are also connected between the external terminals T1 and T2.

Here, in the above-described embodiment, the plurality of third wiring portions may be formed in the same direction as the plurality of first wiring portions, and the plurality of fourth wiring portions may be formed in the same direction as the plurality of second wiring portions. In this case, the second region is easily formed, and cost of the entire circuit can be reduced.

Further, the plurality of third wiring portions may be commonly electrically connected to a first external terminal, and the plurality of fourth wiring portions may be commonly electrically connected to a second external terminal. In this case, a large-capacitance capacitor can be formed by connecting the capacitances of the capacitors formed by the second region in parallel.

Further, the plurality of third wiring portions may be electrically connected alternately to a first external terminal and a second external terminal, and the plurality of fourth wiring portions may be electrically connected alternately to the first external terminal and the second external terminal. In this way, a large-capacitance capacitor can be formed by connecting the capacitances of the capacitors formed by the second region in parallel.

Further, the line width or interval of the plurality of third wiring portions along the first surface may be larger than that of the plurality of first wiring portions. In this case, the probability of short-circuiting between wirings of the adjacent capacitors can be reduced, or the probability of defective capacitors can be reduced by increasing the distance between the wirings of the capacitors formed in the second region. In addition, a large capacitance of the capacitor can be realized by making a design different from that of the first region.

Further, the line width or interval of the plurality of fourth wiring portions along the second surface may be larger than that of the plurality of second wiring portions. In this case, the probability of short-circuiting between wirings of the adjacent capacitors can be reduced, or the probability of defective capacitors can be reduced by increasing the distance between the wirings of the capacitors formed in the second region. In addition, a large capacitance of the capacitor can be realized by making a design different from that of the first region.

Further, in the second layer forming step, the plurality of storage elements may be formed by forming the storage element material along the first surface and etching the storage element material in the first region, and the insulator may be formed in the second region after the storage element material in the second region is removed. In this case, the formation of the plurality of storage elements in the first region and the formation of the insulator forming the capacitor in the second region can be performed efficiently.

In addition, in the second layer forming step, the plurality of storage elements may be formed by forming the coating material having the hole portions along the first surface and embedding the storage element material in the hole portions of the coating material in the first region, and the insulator may be formed in the second region after the coating material in the second region is removed. With such a configuration, the formation of a plurality of storage elements in the first region and the formation of the insulator constituting the capacitor in the second region can be performed efficiently.

INDUSTRIAL APPLICABILITY

One aspect of the present invention is to be applied to a semiconductor device and a method for manufacturing the same and to curb an increase in a circuit area.

REFERENCE SIGNS LIST

1 Nonvolatile memory device (semiconductor device)
3 Semiconductor substrate
3a Main surface
5 Memory array region (first region)
7 Peripheral circuit region (second region)
11 Word line (first wiring portion)
13 Memory cell (storage element)
15 Bit line (second wiring portion)
17 Intersection portion
19 Linear electrode (third wiring portion)
21 Linear electrode (fourth wiring portion)
23 Insulator
25 Intersection portion
35 Storage element material
37 Coating material
39 Hole portion
T1, T2 External terminal

The invention claimed is:

1. A semiconductor device comprising:
a semiconductor substrate;
a first region including a plurality of first wiring portions formed linearly to be parallel to each other along a first surface having a first height on the semiconductor substrate, a plurality of second wiring portions formed linearly along a second surface having a second height on the semiconductor substrate in a direction intersecting the plurality of first wiring portions, and a plurality of storage elements provided to be connected to the first wiring portion and the second wiring portion between an intersection portion of each of the plurality of first wiring portions with the plurality of second wiring portions when seen from a direction perpendicular to the first surface and each of the plurality of second wiring portions; and
a second region including a plurality of third wiring portions formed linearly to be parallel to each other along the first surface on the semiconductor substrate, a plurality of fourth wiring portions formed linearly along the second surface on the semiconductor substrate in a direction intersecting the plurality of third wiring portions, and an insulator disposed between the third wiring portion and the fourth wiring portion.

2. The semiconductor device according to claim 1, wherein:
the plurality of third wiring portions are formed in the same direction as the plurality of first wiring portions, and
the plurality of fourth wiring portions are formed in the same direction as the plurality of second wiring portions.

3. The semiconductor device according to claim 1, wherein:
the plurality of third wiring portions are commonly electrically connected to a first external terminal; and
the plurality of fourth wiring portions are commonly electrically connected to a second external terminal.

4. The semiconductor device according to claim 1, wherein:

the plurality of third wiring portions are electrically connected alternately with a first external terminal and a second external terminal, and the plurality of fourth wiring portions are electrically connected alternately with the first external terminal and the second external terminal.

5. The semiconductor device according to claim 1, wherein a line width or an interval of the plurality of third wiring portions along the first surface is larger than that of the plurality of first wiring portions.

6. The semiconductor device according to claim 1, wherein a line width or an interval of the plurality of fourth wiring portions along the second surface is larger than that of the plurality of second wiring portions.

7. A method for manufacturing a semiconductor device, the method comprising:

a first layer forming step of linearly forming a plurality of first wiring portions to be parallel to each other in a first region along a first surface having a first height on a semiconductor substrate and linearly forming a plurality of third wiring portions to be parallel to each other in a second region along the first surface on the semiconductor substrate;

a second layer forming step of forming a plurality of storage elements to be separately connected to the first wiring portions on each of the plurality of first wiring portions and forming an insulator on each of the plurality of third wiring portions; and a third layer forming step of linearly forming a plurality of second wiring portions in a direction intersecting the plurality of first wiring portions in a region corresponding to the first region along a second surface having a second height on the semiconductor substrate and connected to the plurality of storage elements and linearly forming a plurality of fourth wiring portions in a direction intersecting the plurality of third wiring portions in a region corresponding to the second region along the second surface on the semiconductor substrate while the insulator is sandwiched between the plurality of third wiring portions and the plurality of fourth wiring portions.

8. The method according to claim 7, wherein, in the second layer forming step, the plurality of storage elements are formed by forming a storage element material along the first surface and etching the storage element material in the first region, and the insulator is formed in the second region after the storage element material in the second region is removed.

9. The method according to claim 7, wherein, in the second layer forming step, the plurality of storage elements are formed by forming a coating material having a hole portion along the first surface and embedding a storage element material in the hole portion of the coating material in the first region, and the insulator is formed in the second region after the coating material in the second region is removed.

* * * * *